(12) United States Patent
Song et al.

(10) Patent No.: US 11,362,290 B2
(45) Date of Patent: Jun. 14, 2022

(54) DISPLAY SUBSTRATE, METHOD OF MANUFACTURING DISPLAY SUBSTRATE, AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Li Song, Beijing (CN); Zhiliang Jiang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 269 days.

(21) Appl. No.: 16/623,329

(22) PCT Filed: Aug. 12, 2019

(86) PCT No.: PCT/CN2019/100189
§ 371 (c)(1),
(2) Date: Dec. 16, 2019

(87) PCT Pub. No.: WO2020/042894
PCT Pub. Date: Mar. 5, 2020

(65) Prior Publication Data
US 2021/0367170 A1 Nov. 25, 2021

(30) Foreign Application Priority Data
Aug. 31, 2018 (CN) .......................... 201811013239.7

(51) Int. Cl.
*H01L 51/00* (2006.01)
*H01L 51/56* (2006.01)

(52) U.S. Cl.
CPC .......... *H01L 51/0097* (2013.01); *H01L 51/56* (2013.01); *H01L 2251/5338* (2013.01)

(58) Field of Classification Search
None
See application file for complete search history.

(56) References Cited

U.S. PATENT DOCUMENTS 9,960,213 B2  5/2018  Senda et al.
2015/0311260 A1 10/2015 Senda et al.
(Continued)

FOREIGN PATENT DOCUMENTS

CN   106997930 A   8/2017
CN   107195794 A   9/2017
(Continued)

*Primary Examiner* — J. E. Schoenholtz
(74) *Attorney, Agent, or Firm* — Kinney & Lange, P.A.

(57) ABSTRACT

Embodiments of the present disclosure provide a display substrate, a method of manufacturing a display substrate, and a display apparatus. The display substrate includes a display area and a non-display area. The display substrate further includes: a base substrate; and a first insulating layer and a second insulating layer disposed on the base substrate in sequence. The first insulating layer includes a first slot located in the non-display area and filled with a first filler, and the second insulating layer includes a second slot located in the non-display area.

14 Claims, 7 Drawing Sheets

(56) References Cited

U.S. PATENT DOCUMENTS

| | | | | |
|---|---|---|---|---|
| 2018/0061910 A1* | 3/2018 | Cai | ................... | H01L 27/3223 |
| 2019/0012031 A1* | 1/2019 | Kim | ................... | H01L 51/5203 |
| 2019/0058030 A1* | 2/2019 | Choi | ................... | H01L 51/5253 |
| 2019/0245156 A1* | 8/2019 | Kwon | ................... | G06F 3/044 |
| 2020/0013970 A1* | 1/2020 | Wang | ................ | H01L 27/3276 |

FOREIGN PATENT DOCUMENTS

| | | |
|---|---|---|
| CN | 108364987 A | 8/2018 |
| CN | 109103234 A | 12/2018 |

\* cited by examiner

DISPLAY SUBSTRATE, METHOD OF MANUFACTURING DISPLAY SUBSTRATE, AND DISPLAY APPARATUS

CROSS-REFERENCE TO RELATED APPLICATION

This application is a Section 371 National Stage Application of International Application No. PCT/CN2019/100189, filed on Aug. 12, 2019, entitled "DISPLAY SUBSTRATE, METHOD OF MANUFACTURING DISPLAY SUBSTRATE, AND DISPLAY APPARATUS", which has not yet published, which claims priority to Chinese Patent Application No. 201811013239.7, filed on Aug. 31, 2018, incorporated herein by reference in their entireties.

TECHNICAL FIELD

Embodiments of the present disclosure relate to the field of display technology, and particularly to a display substrate, a method of manufacturing a display substrate, and a display apparatus.

BACKGROUND

An organic light-emitting diode (OLED) is widely applied to electronic products such as televisions and mobile phones due to its advantages such as light weight, thin thickness, and low power consumption.

In an existing manufacturing process for an OLED display substrate, the OLED display substrate needs to be cut or handled after packaging of an electroluminescent structure is completed. It has been found that in cutting or handling, a crack is easily generated in the OLED display substrate due to an external force, and the generated crack will extend and expand into an inside of the OLED display substrate. This not only affects quality and performance of the OLED display substrate, but also reduces a service life of the OLED display substrate.

SUMMARY

In accordance with an aspect of the present disclosure, embodiments provide a display substrate. The display substrate includes a display area and a non-display area. The display substrate further includes: a base substrate; and a first insulating layer and a second insulating layer disposed on the base substrate in sequence. The first insulating layer includes a first slot located in the non-display area and filled with a first filler. The second insulating layer includes a second slot located in the non-display area.

Optionally, the second slot is filled with a second filler.

Optionally, there is no overlap between an orthogonal projection of the first slot on the base substrate and an orthogonal projection of the second slot on the base substrate.

Optionally, between orthogonal projections of any two adjacent first slots on the base substrate, there is an orthogonal projection of one second slot on the base substrate, and between orthogonal projections of any two adjacent second slots on the base substrate, there is an orthogonal projection of one first slot on the base substrate.

Optionally, an orthogonal projection of the first slot on the base substrate and an orthogonal projection of the second slot on the base substrate coincide with each other.

Optionally, the first slot includes a first through hole passing through the first insulating layer, and the second slot includes a second through hole passing through the second insulating layer.

Optionally, the first filler and the second filler are the same.

Optionally, the first filler includes polyvinylidene fluoride, polyurethane or polytetrafluoroethylene, and the second filler includes polyvinylidene fluoride, polyurethane or polytetrafluoroethylene.

Optionally, the first insulating layer includes: a barrier layer; and a buffer layer located on a side of the barrier layer facing away from the base substrate, and the second insulating layer includes: a gate insulating layer; and an interlayer insulating layer located on a side of the gate insulating layer facing away from the base substrate.

In accordance with another aspect of the present disclosure, embodiments further provided a display apparatus. The display apparatus includes the display substrate according to any one of the above embodiments.

In accordance with still another aspect of the present disclosure, embodiments further provided a method of manufacturing a display substrate. The display substrate includes a display area and a non-display area. The method includes steps of: providing a base substrate; forming a first insulating layer and a second insulating layer on the base substrate in sequence, wherein the first insulating layer includes a first slot located in the non-display area, and the second insulating layer includes a second slot located in the non-display area; and filling the first slot with a first filler.

Optionally, the step of forming the first insulating layer and the second insulating layer on the base substrate in sequence includes substeps of: forming the first insulating layer on the base substrate; forming the first slot, located in the non-display area, in the first insulating layer; forming a second insulating layer on the first insulating layer; and forming the second slot, located in the non-display area, in the second insulating layer. Further, In this case, the method further includes steps of: filling the second slot with a second filler.

Optionally, the step of forming the first insulating layer and the second insulating layer on the base substrate in sequence includes substeps of: forming the first insulating layer and the second insulating layer on the base substrate in sequence; and forming the first slot and the second slot, located in the non-display area, in the first insulating layer and the second insulating layer simultaneously, such that the first slot includes a first through hole passing through the first insulating layer, the second slot includes a second through hole passing through the second insulating layer, and an orthogonal projection of the first slot on the base substrate and an orthogonal projection of the second slot on the base substrate coincide with each other. Further, In this case, the method further includes steps of: filling the first slot and the second slot with the first filler simultaneously.

Other features and advantages of the present disclosure will be set forth in the description which follows and, in part, will be obvious from the description, or may be learned by practice of the present disclosure. The objects and other advantages of the present disclosure can be achieved and obtained by structures specifically pointed out in the description, the claims, and the drawings.

BRIEF DESCRIPTION OF THE DRAWINGS

The drawings are used to provide further understanding of technical solutions of the present disclosure and constitute a part of the description. The technical solutions of the present disclosure are explained by means of the drawings together with the embodiments of the present application. However, the drawings do not constitute any limitation on the technical solutions of the present disclosure.

DETAILED DESCRIPTION

In order that the objects, technical solutions and advantages of the present disclosure become more apparent, the embodiments of the present disclosure will be described in detail with reference to the drawings as below. It is to be noted that the embodiments of the present application may be discretionarily combined with one another unless they conflict and the features in the embodiments may be discretionarily combined with one another unless they conflict.

The steps shown in the appended flow diagrams may be performed in a computer system such as a set of computer-executable instructions. Also, although the logical order is shown in the flow diagrams, in some cases, the steps shown or described may be performed in a different order.

Unless otherwise defined, technical or scientific terms used in the embodiments of the present disclosure should have the same meaning as commonly understood by one of ordinary skill in the art to which the present disclosure pertains. The terms "first" and "second" and similar words and phrases used in the embodiments of the present disclosure are used only for distinguishing different components from one another rather than indicating any sequence, number or importance. The term "comprise", "comprising", "include", "including" or any other similar word or phrase is intended to specify that an element or item that appears before the term covers an element or item that appears after the term and is listed and its equivalent, but do not exclude other elements or items. The term "connect", "connected" or any other similar word or phrase is not limited to only a physical or mechanical connection but may include an electrical connection, regardless of a direct connection or an indirect connection. The terms "upper", "lower", "left", "right" and the like are used to indicate only relative positional relationships. After an absolute position of an object being described is changed, the relative positional relationships may also change accordingly.

Figure 1:
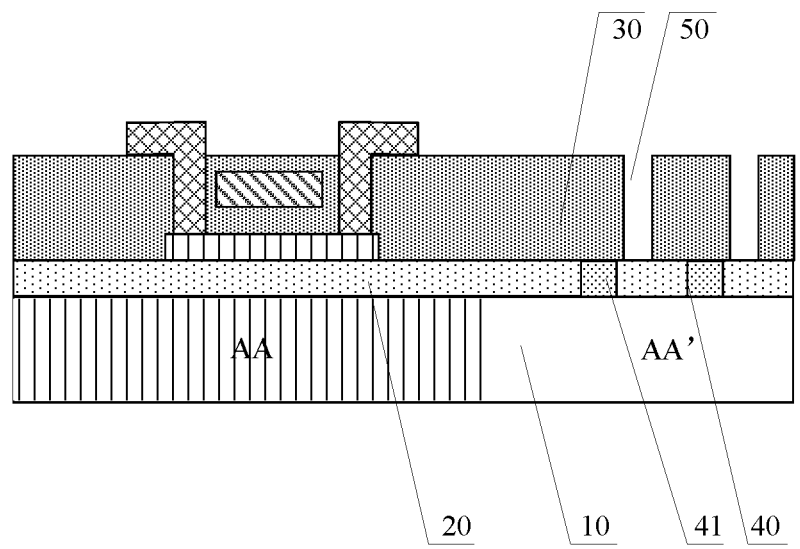
FIG. 1 is a schematic view showing a structure of a display substrate according to an embodiment of the present disclosure.

FIG. 1 is a schematic view showing a structure of a display substrate according to an embodiment of the present disclosure. As shown in FIG. 1, embodiments of the present disclosure provide a display substrate including a display area AA and a non-display area AA'. In addition, the display substrate according to the embodiments of the present disclosure further includes a base substrate 10; and a first insulating layer 20 and a second insulating layer 30 disposed on the base substrate 10 in sequence.

Specifically, the first insulating layer 20 includes a first slot 40 located in the non-display area AA' and filled with a first filler 41. Similarly, the second insulating layer 30 includes a second slot 50 located in the non-display area.

Optionally, the base substrate 10 may be a glass base substrate, a plastic base substrate, or the like, or may be made of polyimide. There is no limitation on this in the embodiments of the present disclosure. Furthermore, the base substrate may be pre-cleaned before the first insulating layer 20 is formed. It is to be noted that the display area AA is configured such that an electroluminescent structure is disposed in the display area AA to display an image, while the non-display area AA' is configured such that a peripheral circuit for the display area AA is disposed in the non-display area AA'.

Optionally, the number of the first slot 40 is equal to or greater than one, and the number of the second slot 50 is equal to or greater than one. The number of the first slot 40 and the number of the second slot 50 may be the same or different. There is no limitation on this in the embodiments of the present disclosure. In addition, distances between adjacent first slots may be equal or unequal to one another. Likewise, distances between adjacent second slots may be equal or unequal to one another. Of course, the present disclosure is not limited to these and they may be specifically determined according to actual requirements.

Optionally, the first filler 41 is a flexible hydrophobic material. For example, the first filler 41 may include polyvinylidene fluoride, polyurethane or polytetrafluoroethylene. Alternatively, the first filler may also be made by hydrophobically treating a flexible material.

Specifically, the flexibility of the first filler 41 can disperse a lateral tensile stress at a tip of a crack, thereby effectively preventing the crack from expanding. Furthermore, the hydrophobicity of the flexible hydrophobic material can also effectively block a penetration of moisture, thereby preventing devices in the display substrate from deteriorating in performance.

Figure 2:
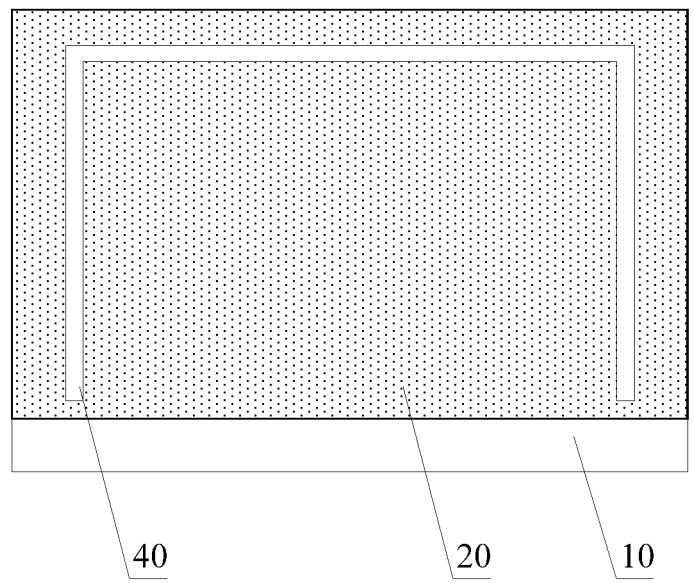
FIG. 2 is a top view of a display substrate according to an embodiment of the present disclosure.

FIG. 2 is a top view of a display substrate according to an embodiment of the present disclosure. Like the embodiment shown in FIG. 1, in this case, a cross section of the first slot 40 has a rectangular shape in the display substrate as shown in FIG. 2.

In addition, in order to prevent the crack from spreading into the display area, as shown in FIG. 2, the first slot 40 may be designed in a "Π" shape when viewed in the top view. In other words, the first slot 40 does not completely surround the entire display area. This is because some circuits are generally disposed on one side of the display substrate. Therefore, in order not to affect the performance of the display substrate, generally no first slot is provided on the side of the display substrate where the circuits are disposed. Likewise, a cross section of the second slot 50 may also be designed in a rectangular shape, and the second slot 50 may also be designed in a "Π" shape when viewed in the top view although not shown.

For example, a material of which the first insulating layer 20 is made may include an inorganic material. For example, silicon oxide, silicon nitride, or a composite of silicon oxide and silicon nitride may be selected. In this way, the first insulating layer 20 is mainly used to flatten the display substrate and prevent substances on the base substrate from entering the electroluminescent structure.

Optionally, a material of which the second insulating layer 30 is made may also include an inorganic material. For example, silicon oxide, silicon nitride, or a composite of silicon oxide and silicon nitride may also be selected. There is no limitation on this in the embodiments of the present disclosure.

Embodiments of the present disclosure provide a display substrate including a display area and a non-display area. Further, the display substrate further includes: a base substrate; and a first insulating layer and a second insulating layer disposed on the base substrate in sequence. The second insulating layer includes a gate insulating layer and an interlayer insulating layer. Furthermore, the first insulating layer includes a first slot located in the non-display area and filled with a first filler. In addition, the second insulating layer also includes a second slot located in the non-display area. According to the embodiments of the present disclosure, in the provided technical solution, the first slot is formed in a portion of the first insulating layer located in the non-display area, and is filled with the first filler, and similarly, the second slot is formed in a portion of the second insulating layer located in the non-display area. In this way, the crack can be prevented from expanding in the display substrate, thereby not only improving the quality and performance of the OLED display substrate, but also prolonging the service life of the OLED display substrate.

Figure 3:
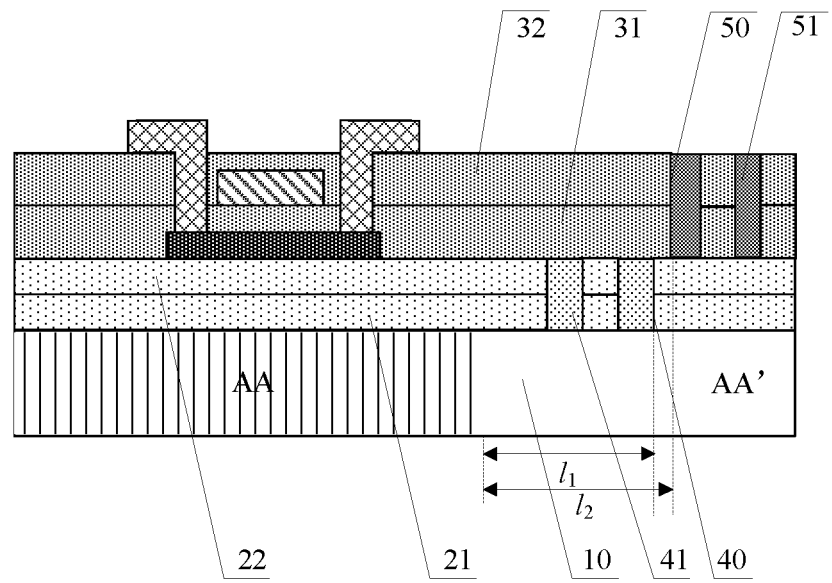
FIG. 3 is a schematic view showing a structure of a display substrate according to an embodiment of the present disclosure.

FIG. 3 is a schematic view showing a structure of a display substrate according to an embodiment of the present disclosure. As shown in FIG. 3, optionally, the first insulating layer includes a barrier layer 21 and a buffer layer 22.

Specifically, the buffer layer 22 is disposed on a side of the barrier layer 21 facing away from the base substrate 10.

Optionally, the barrier layer 21 can not only prevent organic substances and the like on the base substrate from entering the electroluminescent structure, but can also avoid an occurrence of an arc discharge phenomenon of the display substrate in a vapor deposition chamber.

Optionally, a material of which the barrier layer 21 is made may be a material having a high resistivity, such as titanium dioxide, silicon oxide, silicon nitride, or a composite of silicon oxide and silicon nitride. There is no limitation on this in the embodiments of the present disclosure. Optionally, the barrier layer 21 has a thickness of 50-500 nm.

Optionally, the buffer layer 22 can be used to further prevent substances in the base substrate 10 from being diffused in subsequent processes to affect the quality of an active layer, and can also improve the connection strength between the buffer layer and upper and lower layer structures. Further, the buffer layer 22 also helps to avoid an influence on the base substrate when the active layer is formed.

Optionally, a material of which the buffer layer 22 is made may be silicon oxide, silicon nitride, or silicon oxide and silicon nitride. There is no limitation on this in the embodiments of the present disclosure. Optionally, the buffer layer 22 has a thickness of 50-500 nm.

Optionally, as shown in FIG. 3, the second insulating layer includes a gate insulating layer 31 and an interlayer insulating layer 32.

Specifically, the interlayer insulating layer 32 is located on a side of the gate insulating layer 31 facing away from the base substrate 10.

Optionally, the first slot 40 is a through hole. Namely, the first slot 40 passes through the entire first insulating layer 20 to extend to the base substrate 10 below the first insulating layer 20. In other words, the first slot 40 has a depth equal to a thickness of the first insulating layer 20. Of course, the above is only an optional solution in which the first slot 40 is designed as the through hole, and generally the present disclosure is not limited only to this. In other words, if the first slot 40 is not formed as the through hole, the depth of the first slot 40 may also be less than the thickness of the first insulating layer 20.

Optionally, the second slot 50 may also be a through hole. Namely, the second slot 50 passes through the entire second insulating layer 30 to extend to the first insulating layer 20 below the second insulating layer 30. In other words, the second slot 50 has a depth equal to a thickness of the second insulating layer 30. Of course, the above is only an optional solution in which the second slot 50 is designed as the through hole, and generally the present disclosure is not limited only to this. In other words, if the second slot 50 is not formed as the through hole, the depth of the second slot 50 may also be less than the thickness of the second insulating layer 30.

Optionally, in order to achieve a crack prevention effect of the display substrate more completely, the first slot 40 passes through to the base substrate 10 and the second slot 50 passes through to the first insulating layer 20. It is to be noted that in FIGS. 1 and 3, illustrations are carried out by means of examples in which the first slot 40 passes through to the base substrate 10 and the second slot 50 passes through to the first insulating layer 20, but the embodiments of the present disclosure are not limited thereto.

Specifically, as shown in FIG. 3, the second slot 50 is also provided with a second filler 51.

Specifically, the second filler 51 is a flexible hydrophobic material. For example, the second filler 51 may include polyvinylidene fluoride, polyurethane or polytetrafluoroethylene. Alternatively, the second filler 51 may also be formed by hydrophobically treating a flexible material so that the flexible material has hydrophobicity.

Specifically, the flexibility of the second filler 51 can disperse a lateral tensile stress at a tip of a crack, thereby effectively preventing the crack from expanding. In addition, the hydrophobicity of the flexible hydrophobic material can also effectively block a penetration of moisture, thereby preventing devices in the display substrate from deteriorating in performance.

It is to be noted that materials of which the first filler 41 and the second filler 51 are respectively made may be the same or different. There is no limitation on this in the embodiments of the present disclosure. It is to be noted that in FIG. 3, an illustration is carried out by means of an example in which the first filler 41 and the second filler 51 are made of different materials.

Specifically, the materials of which the first filler 41 and the second filler 51 are respectively made may be different. For example, the material of which the first filler 41 is made is polyvinylidene fluoride, and the material of which the second filler 51 is made is polyurethane or polytetrafluoroethylene. Alternatively, the material of which the first filler 41 is made is polyurethane, and the material of which the second filler 51 is made is polyvinylidene fluoride or polytetrafluoroethylene. Further alternatively, the material of which the first filler 41 is made is polytetrafluoroethylene, and the material of which the second filler 51 is made is polyvinylidene fluoride or polyurethane or the like.

Optionally, as an embodiment, in the provided display substrate, there is no overlap between an orthogonal projection of the first slot 40 on the base substrate 10 and an orthogonal projection of the second slot 50 on the base substrate 10.

Specifically, the first slot 40 and the second slot 50 may be positioned in the following manner. For example, a distance between the display area and one of a plurality of first slots 40 which is farthest from the display area is less than a distance between the display area and one of a plurality of second slots 50 which is closest to the display area. Alternatively, a distance between the display area and one of the plurality of first slots 40 which is closest to the display area is greater than a distance between the display area and one of the plurality of second slots 50 which is farthest from the display area. Further alternatively, when each of the number of the first slot 40 and the number of the second slot 50 is equal to or greater than two, orthogonal projections of the first slots 40 on the base substrate 10 and orthogonal projections of the second slots 50 on the base substrate 10 are alternately disposed. In other words, between orthogonal projections of any two adjacent first slots 40 on the base substrate 10, there is an orthogonal projection of one second slot 50 on the base substrate 10, and between orthogonal projections of any two adjacent second slots 50 on the base substrate 10, there is an orthogonal projection of one first slot 40 on the base substrate 10.

Specifically, when each of the number of the first slot 40 and the number of the second slot 50 is equal to or greater than two, the orthogonal projections of the plurality of first slots 40 on the base substrate 10 and the orthogonal projections of the plurality of second slots 50 on the base substrate 10 are alternately disposed. This means that an orthogonal projection of one first slot 40 on the base substrate 10 is located between orthogonal projections of two adjacent second slots 50 on the base substrate, or an orthogonal projection of one second slot 50 on the base substrate 10 is located between orthogonal projections of two adjacent first slots 40 on the base substrate.

Figure 4:
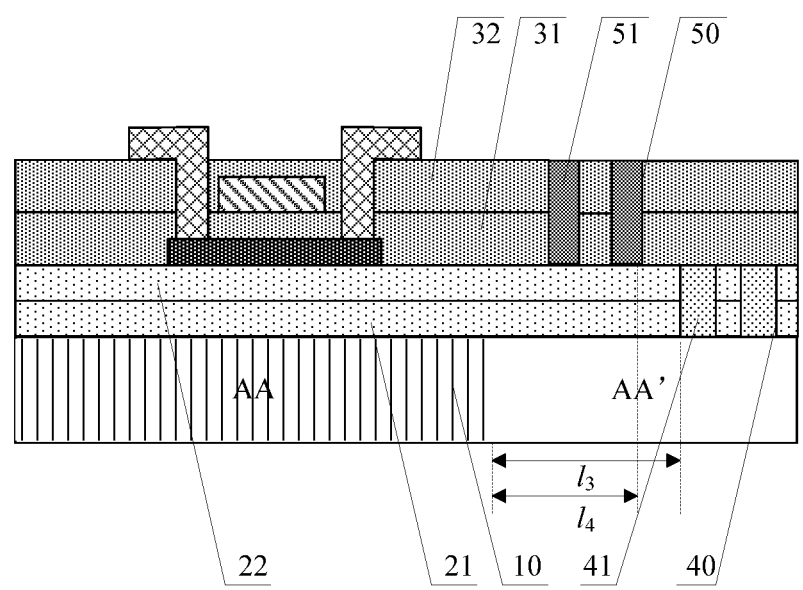
FIG. 4 is a schematic view showing a structure of a display substrate according to an embodiment of the present disclosure.
Figure 5:
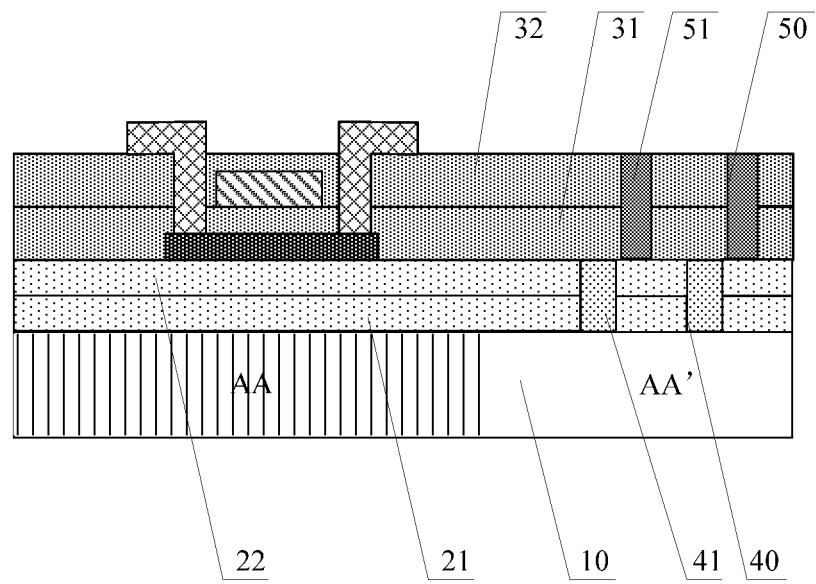
FIG. 5 is a schematic view showing a structure of a display substrate according to an embodiment of the present disclosure.

Specifically, FIG. 4 is a schematic view showing a structure of a display substrate according to an embodiment of the present disclosure, and FIG. 5 is a schematic view showing a structure of a display substrate according to an embodiment of the present disclosure. In FIG. 3, an illustration is carried out by means of an example in which a distance $l_1$ between the display area and the first slot 40 which is farthest from the display area is less than a distance $l_2$ between the display area and the second slot which is closest to the display area. In FIG. 4, an illustration is carried out by means of an example in which a distance $l_3$ between the display area and the first slot 40 which is closest to the display area is greater than a distance $l_4$ between the display area and the second slot which is farthest from the display area. In FIG. 5, an illustration is carried out by means of an example in which the orthogonal projections of the plurality of first slots 40 on the base substrate and the orthogonal projections of the plurality of second slots 50 on the base substrate are alternately disposed. Further, it is to be noted that in each of FIGS. 3 to 5, an illustration is carried out by means of an example in which the second filler 51 is included, but according to embodiments of the present disclosure, the second filler may not be included in the second slot.

According to embodiments of the present disclosure, when the second filler is included in the second slot 50, the materials of which the first filler 41 and the second filler 51 are respectively made may be the same or different. This may be specifically determined according to actual requirements, and there is no limitation on this in the embodiments of the present disclosure.

When the materials of which the first filler 41 and the second filler 51 are respectively made are different, a lower-cost hydrophobic material may be used on the first insulating layer, and a higher-cost hydrophobic material may be used on the second insulating layer, so that the cost of the display substrate can be controlled. When the materials of which the first filler 41 and the second filler 51 are respectively made are the same, a manufacturing process can be simplified.

Figure 6:
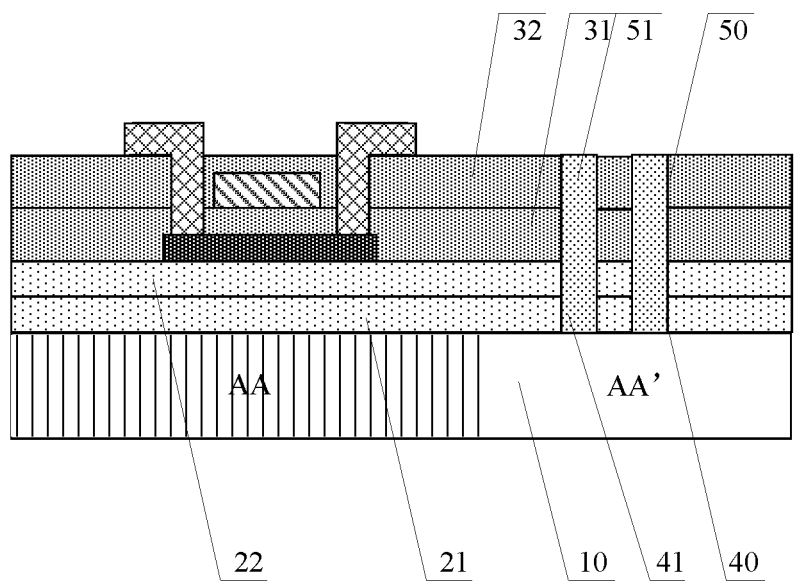
FIG. 6 is a schematic view showing a structure of a display substrate according to an embodiment of the present disclosure.
Figure 7:
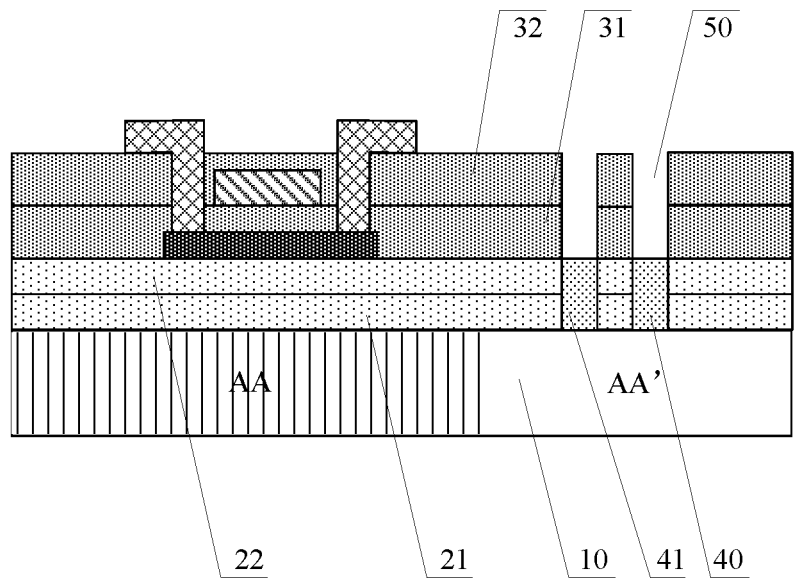
FIG. 7 is a schematic view showing a structure of a display substrate according to an embodiment of the present disclosure.

Alternatively, as another embodiment, FIG. 6 is a schematic view showing a structure of a display substrate according to an embodiment of the present disclosure, and FIG. 7 is a schematic view showing a structure of a display substrate according to an embodiment of the present disclosure. As shown in FIGS. 6 and 7, orthogonal projections of the first slots 40 on the base substrate 10 and orthogonal projections of the second slots 50 on the base substrate 10 coincide with each other.

It is to be noted that in FIG. 6, an illustration is carried out by means of an example in which the second filler 51 is included, while in FIG. 7, an illustration is carried out by means of an example in which the second filler may not be included in the second slot.

As shown in FIG. 6, when the second filler 51 is included in the second slot 50, the materials of which the first filler 41 and the second filler 51 are respectively made may be the same and integrally formed in order to simplify the manufacturing process.

Figure 8:
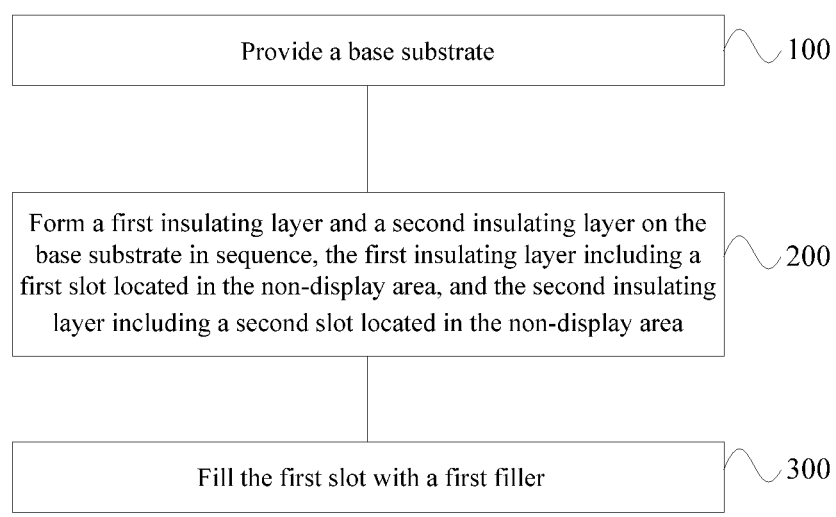
FIG. 8 is a flow diagram of a method of manufacturing a display substrate according to an embodiment of the present disclosure.

Based on the same inventive concept, embodiments of the present disclosure further provide a method of manufacturing a display substrate. In the embodiments, the display substrate includes a display area and a non-display area. Specifically, FIG. 8 is a flow diagram of a method of manufacturing a display substrate according to an embodiment of the present disclosure. As shown in FIG. 8, a method of manufacturing a display substrate according to the embodiments of the present disclosure specifically includes the following steps.

In a step 100, a base substrate is provided.

Optionally, the base substrate may be a glass base substrate, a plastic base substrate, or the like, or may be made of polyimide. There is no limitation on this in the embodiments of the present disclosure. Furthermore, the base substrate may be pre-cleaned before the first insulating layer is formed.

In a step 200, the first insulating layer and the second insulating layer are formed on the base substrate in sequence. The first insulating layer includes a first slot located in the non-display area, and the second insulating layer includes a second slot located in the non-display area.

Specifically, as a first embodiment, the step 200 may include the substeps of: forming the first insulating layer on the base substrate; forming the first slot in a portion of the first insulating layer located in the non-display area; forming a second insulating layer on the first insulating layer; and forming the second slot in a portion of the second insulating layer located in the non-display area.

Specifically, as a second embodiment, the step 200 may include the substeps of: forming the first insulating layer and the second insulating layer on the base substrate in sequence; and forming the first slot and the second slot, located in the non-display area, in the first insulating layer and the second insulating layer simultaneously. This means that the first slot and the second slot are through holes passing through the first insulating layer and the second insulating layer, respectively, and an orthogonal projection of the first slot on the base substrate and an orthogonal projection of the second slot on the base substrate coincide with each other.

Optionally, a number of the first slot is equal to or greater than one. In this case, distances between adjacent first slots may be equal or unequal to one another. There is no limitation on this in the embodiments of the present disclosure.

Optionally, a number of the second slot may also be equal to or greater than one. In this case, the number of the first slot and the number of the second slot may be the same or different. There is no limitation on this in the embodiments of the present disclosure. In addition, distances between adjacent second slots may be equal or unequal to one another. The present disclosure is not limited only to these and they may be specifically determined according to actual requirements.

In a step 300, the first slot is filled with a first filler.

Specifically, when the step 200 is performed in the manner in the first embodiment, the step 300 occurs after the step of forming the first slot in the first insulating layer. In contrast, when the step 200 is performed in the manner in the second embodiment, the step 300 occurs after the step of forming the first slot and the second slot in the first insulating layer and the second insulating layer simultaneously.

Embodiments of the present disclosure provide a method of manufacturing a display substrate. In the embodiments, the display substrate includes a display area and a non-display area. Specifically, the method of manufacturing the display substrate includes steps of: providing a base substrate; forming a first insulating layer and a second insulating layer on the base substrate in sequence, the first insulating layer including a first slot located in the non-display area, and the second insulating layer including a second slot located in the non-display area; and filling the first slot with a first filler. According to the technical solution according to the embodiments of the present disclosure, the first slot is formed in the portion of the first insulating layer located in the non-display area, and the filler is disposed in the first slot, and the second slot is formed in the portion of the second insulating layer located in the non-display area. In this way, the crack can be prevented from expanding in the display substrate, thereby not only improving the quality and performance of the OLED display substrate, but also prolonging the service life of the OLED display substrate.

Specifically, the first slot located in the non-display area may be formed in the first insulating layer by a laser process or a photolithographic process, and the first filler may be formed in the first slot by a sputtering process, a vapor deposition process, or a deposition process. Similarly, the second slot located in the non-display area may also be formed in the second insulating layer by the laser process or the photolithographic process.

Optionally, when the step 200 is performed in the manner in the first embodiment, the method of manufacturing the display substrate further includes filling the second slot with a second filler after forming the second slot, located in the non-display area, in the second insulating layer.

Specifically, the second slot may be filled with the second filler by a sputtering process, a vapor deposition process, or a deposition process.

Optionally, when the step 200 is performed in the manner in the second embodiment, the method of manufacturing the display substrate further includes: filling the first slot and the second slot with the first filler simultaneously.

Specifically, the first slot and the second slot may be simultaneously filled with the first filler by a sputtering process, a vapor deposition process, or a deposition process.

Optionally, the step 200 includes the substeps of: forming a barrier layer and a buffer layer on the base substrate in sequence, thereby forming a first insulating layer; and forming a gate insulating layer and an interlayer insulating layer on the first insulating layer in sequence, thereby forming a second insulating layer.

A specific operation process of the method of manufacturing the display substrate according to embodiments of the present disclosure is further described below by means of an example, in which there is no overlap between an orthogonal projection of the first slot on the base substrate and an orthogonal projection of the second slot on the base substrate and the second slot is filled with a second filler, with reference to FIGS. 9A to 9D and 3.

Figure 9A:
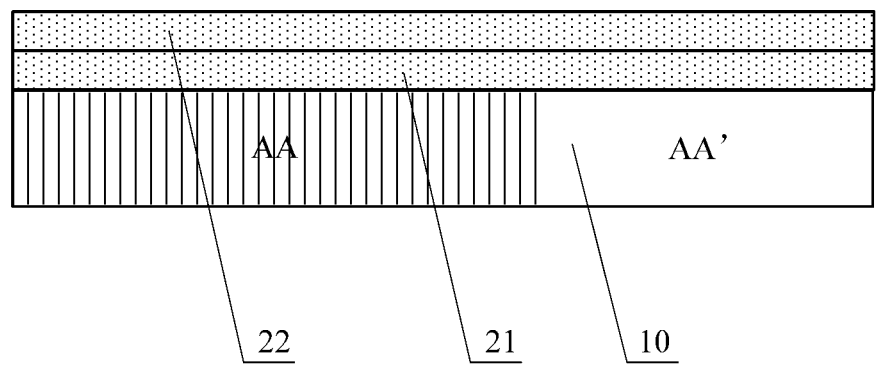
FIGS. 9A-9D are schematic views showing structures of the display substrate at different stages of the method of manufacturing the display substrate according to the embodiment of the present disclosure, respectively.

In a step 310, a first insulating layer including a barrier layer 21 and a buffer layer 22 is formed on the base substrate 10 in sequence, with a structure obtained specifically as shown in FIG. 9A.

Figure 9B:
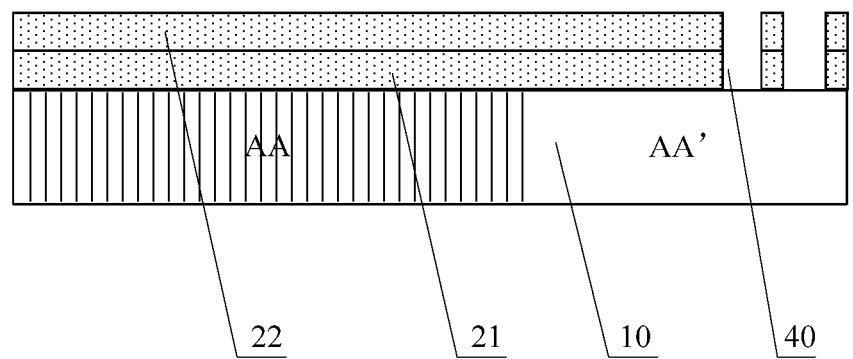

In a step 320, a first slot 40 located in the non-display area is formed in the first insulating layer by a laser etching process or a photolithographic process, with a structure obtained specifically as shown in FIG. 9B.

Figure 9C:
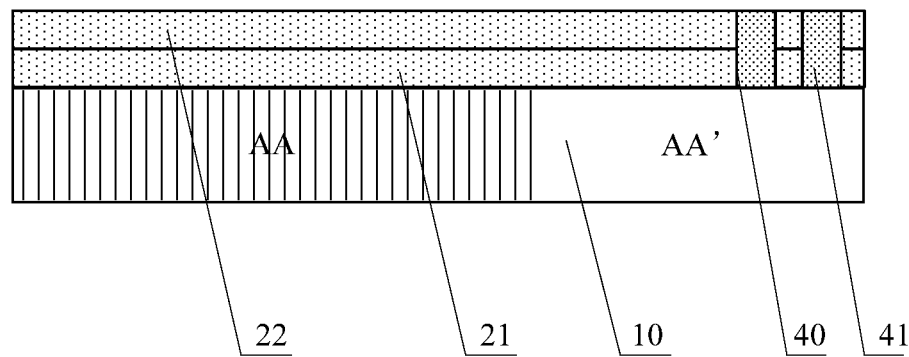

In a step 330, the first slot 40 is filled with a first filler 41, with a structure obtained specifically as shown in FIG. 9C.

Figure 9D:
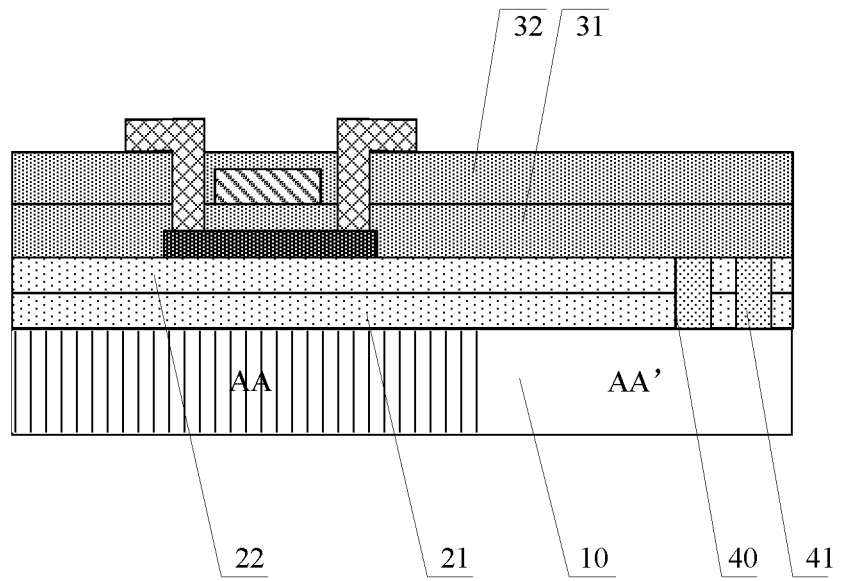

In a step 340, a second insulating layer including a gate insulating layer 31 and an interlayer insulating layer 32 is formed on the first insulating layer, with a structure obtained specifically as shown in FIG. 9D.

In a step 350, a second slot 50 is formed in the second insulating layer, and the second slot 50 is filled with a second filler 51, with a structure obtained specifically as shown in FIG. 3.

A specific operation process of the method of manufacturing the display substrate according to embodiments of the present disclosure is further described below by means of an example, in which an orthogonal projection of the first slot on the base substrate and an orthogonal projection of the second slot on the base substrate coincide with each other and the second slot is filled with a second filler, with reference to FIGS. 10A to 10B and 6.

Figure 10A:
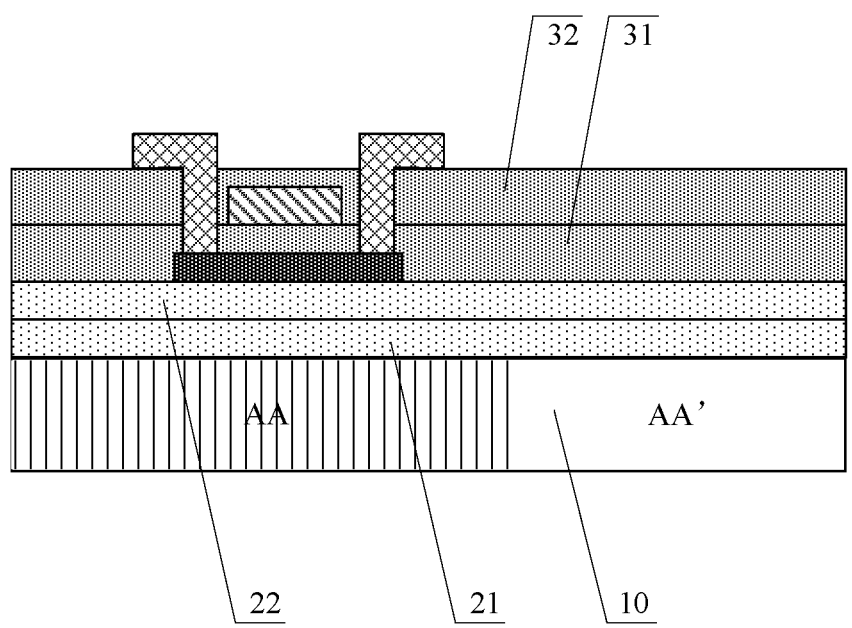
FIGS. 10A-10B are schematic views showing structures of the display substrate at different stages of the method of manufacturing the display substrate according to the embodiment of the present disclosure, respectively.

In a step 410, a first insulating layer including a barrier layer 21 and a buffer layer 22, and a second insulating layer including a gate insulating layer 31 and an interlayer insulating layer 32 are formed on the base substrate 10, with a structure obtained specifically as shown in FIG. 10A.

Figure 10B:
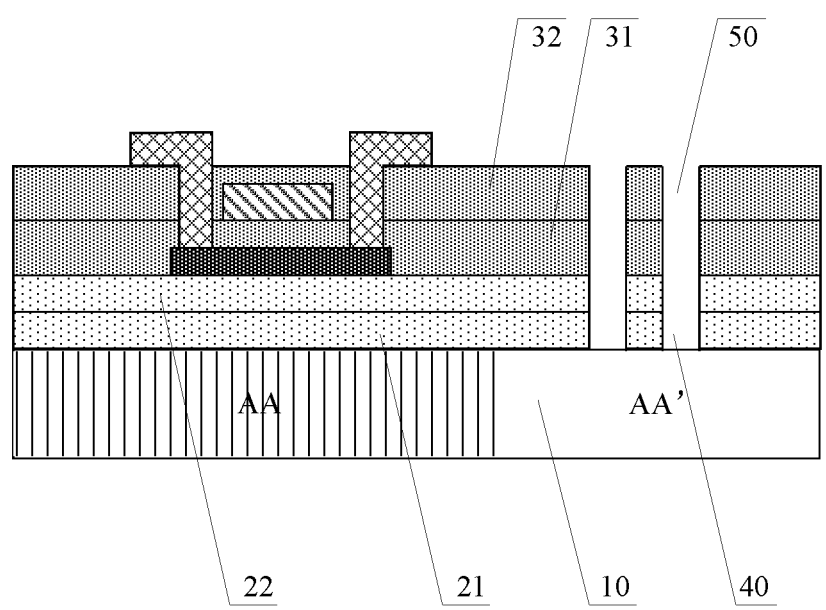

In a step 420, a first slot 40 and a second slot 50 which are located in the non-display area are simultaneously formed in the first insulating layer and the second insulating layer by a laser etching process or a photolithographic process, with a structure obtained specifically as shown in FIG. 10B.

In a step 430, the first slot 40 and the second slot 50 are simultaneously filled with a first filler 41 and a second filler 51, i.e. which are the same, with a structure obtained specifically as shown in FIG. 6.

Based on the same inventive concept, embodiments of the present disclosure further provide a display apparatus. The display apparatus includes the display substrate described in any one of the above embodiments.

Since the display apparatus has the display substrate provided in any one of the above embodiments, it has the same implementing principle and achieved effect as the display substrate. The implementing principle and achieved effect are no longer described for the sake of brevity.

Specifically, the display apparatus may include any products or parts having display function such as an OLED panel, a mobile phone, a tablet computer, a TV, a display, a notebook computer, a digital frame, and navigator.

Although only the structures related to the embodiments of the present disclosure are shown in the drawings of the specification, those skilled in the art should be able to easily conceive other conventional structures not shown, by benefiting from the teaching of the present disclosure.

A thickness and a size of a layer or a microstructure are enlarged in the drawings for describing the embodiments of the present disclosure for the purpose of clarity. It can be understood that when an element such as a layer, a film, a region or a substrate is referred to as being "on" or "under" another element, the element may be "directly on" or "directly under" the other element, or there may also be an intermediate element between them.

The embodiments of the present disclosure or the features in the embodiments of the present disclosure may be combined with one another to obtain new embodiments unless they conflict.

Although the embodiments according to the present disclosure are described above, the described contents are only embodiments for facilitating understanding the present disclosure, and are not intended to limit the present disclosure. Any one skilled in the art may make appropriate modifications and changes to the embodiments in form and detail without departing from the spirit and range disclosed in the present disclosure. However, the protection scope of the present disclosure should be defined by the scope of the appended claims.

What is claimed is:

1. A display substrate comprising: a display area and a non-display area, wherein the display substrate further comprises: a base substrate; and a first insulating layer and a second insulating layer disposed on the base substrate in sequence, wherein:
   the first insulating layer comprises at least two first slots located in the non-display area and filled with a first filler,
   the second insulating layer comprises at least two second slots located in the non-display area,
   there is no overlap between orthogonal projections of the first slots on the base substrate and orthogonal projections of the second slots on the base substrate,
   between orthogonal projections of any two adjacent first slots on the base substrate, there is an orthogonal projection of one second slot on the base substrate, and
   between orthogonal projections of any two adjacent second slots on the base substrate, there is an orthogonal projection of one first slot on the base substrate.

2. The display substrate of claim 1, wherein the second slots are filled with a second filler.

3. The display substrate of claim 1, wherein the first slots comprise first through holes passing through the first insulating layer, and the second slots comprise second through holes passing through the second insulating layer.

4. The display substrate of claim 2, wherein the first filler and the second filler are the same.

5. The display substrate of claim 2, wherein:
   the first filler comprises polyvinylidene fluoride, polyurethane or polytetrafluoroethylene, and
   the second filler comprises polyvinylidene fluoride, polyurethane or polytetrafluoroethylene.

6. The display substrate of claim 1, wherein:
   the first insulating layer comprises: a barrier layer; and a buffer layer located on a side of the barrier layer facing away from the base substrate, and
   the second insulating layer comprises: a gate insulating layer; and an interlayer insulating layer located on a side of the gate insulating layer facing away from the base substrate.

7. A display apparatus comprising the display substrate of claim 1.

8. A method of manufacturing a display substrate, wherein the display substrate comprises a display area and a non-display area, and the method comprises:
   providing a base substrate;
   forming a first insulating layer and a second insulating layer on the base substrate in sequence, wherein the first insulating layer comprises at least two first slots located in the non-display area, and the second insulating layer comprises at least two second slots located in the non-display area; and
   filling the first slots with a first filler;
   wherein there is no overlap between orthogonal projections of the first slots on the base substrate and orthogonal projections of the second slots on the base substrate; and
   wherein:
      between orthogonal projections of any two adjacent first slots on the base substrate, there is an orthogonal projection of one second slot on the base substrate, and
      between orthogonal projections of any two adjacent second slots on the base substrate, there is an orthogonal projection of one first slot on the base substrate.

9. The method of claim 8, wherein forming the first insulating layer and the second insulating layer on the base substrate in sequence comprises:
   forming the first insulating layer on the base substrate;
   forming the first slots, located in the non-display area, in the first insulating layer;
   forming a second insulating layer on the first insulating layer; and
   forming the second slots, located in the non-display area, in the second insulating layer, and
   the method further comprises: filling the second slots with a second filler.

10. The display substrate of claim 1, wherein each of the first slots and the second slots partially surrounds the display area.

11. The display substrate of claim 1, wherein at least one of the first slots and the second slots has a "Π" shape.

12. The display substrate of claim 1, wherein the first filler comprises a flexible hydrophobic material.

13. The display substrate of claim 2, wherein at least one of the first filler or the second filler comprises a flexible hydrophobic material.

14. The method of claim 8, wherein:
   the first insulating layer comprises: a barrier layer; and a buffer layer located on a side of the barrier layer facing away from the base substrate, and the second insulating layer comprises: a gate insulating layer; and an interlayer insulating layer located on a side of the gate insulating layer facing away from the base substrate.

* * * * *